United States Patent [19]

Wills

[11] Patent Number: 5,006,916

[45] Date of Patent: Apr. 9, 1991

[54] VERTICAL-WALLED CONTACTS FOR VLSI SEMICONDUCTOR DEVICES

[75] Inventor: Kendall S. Wills, Houston, Tex.

[73] Assignee: Texas Instruments Incorporated, Dallas, Tex.

[21] Appl. No.: 82,718

[22] Filed: Aug. 3, 1987

Related U.S. Application Data

[62] Division of Ser. No. 630,471, Jul. 11, 1984, Pat. No. 4,720,908.

[51] Int. Cl.⁵ .................. H01L 23/54; H01L 23/48
[52] U.S. Cl. ................................ 357/67; 357/71
[58] Field of Search ........................... 357/67, 71

[56] References Cited

U.S. PATENT DOCUMENTS

| | | | |
|---|---|---|---|
| 4,201,999 | 5/1980 | Howard et al. | 357/67 |
| 4,471,376 | 9/1984 | Morcom et al. | 357/67 |
| 4,507,853 | 4/1985 | McDavid | 357/71 |
| 4,514,751 | 4/1985 | Bhattachary | 357/67 |
| 4,589,196 | 5/1986 | Anderson | 357/71 |
| 4,698,125 | 10/1987 | Rhodes | 357/71 |

Primary Examiner—Rolf Hille
Assistant Examiner—S. V. Clark
Attorney, Agent, or Firm—Theodore D. Lindgren; Thomas W. DeMond; Melvin Sharp

[57] ABSTRACT

A contact and interconnect for an MOS VLSI semiconductor device employs a contact hole in an insulator coating; the contact hole has vertical instead of sloped sidewalls. A first metallization is applied by CVD so that the sidewalls will be coated to a uniform thickness, then this first metal is anisotropicalloy etched to leave metal sidewalls. A second metallization is applied by sputtering or evaporation, which provides a more dense and electromigration-resistant coating. A refractory metal layer may be interposed between the metallization and the silicon substrate, and also between the metal interconnect and the insulator, since the insulator usually contains phosphorus.

5 Claims, 1 Drawing Sheet

VERTICAL-WALLED CONTACTS FOR VLSI SEMICONDUCTOR DEVICES

This is a divisional of application U.S. Ser. No. 630,471, filed July 11, 1984, now U.S. Pat. No. 4,720,908.

This invention relates to contacts and interconnects for semiconductor integrated circuit devices, and more particularly to methods of manufacture of MOS VLSI devices employing metal contacts made through aperatures in an insulator coating.

In the manufacture of MOS VLSI devices, for example dynamic RAMs as disclosed in U.S. Pat. Nos. 4,055,444 and 4,388,121, issued to G. R. Mohan Rao, assigned to Texas Instruments, it has been the practice to employ a phosphosilicate glass as an insulating coating, and to make contacts to the silicon or other layers beneath the insulator by etching holes in the insulator then flowing the insulator by heating ("densifying") to slope the sidewalls. Thus, the deposited metal would cover the sloped walls with no discontinuities. However, in the manufacture of devices of extremely high component density, as needed for DRAMs of the 1-Megabit size, for example, it is necessary to make the sidewalls of the contact holes vertical instead of sloped, to save space. This can cause voids in the contact because the contact hole is not filled with metal by conventional sputtering or evaporation; i.e., the step coverage is poor and cracks can develop at the point where the metal goes over the edge. In order to avoid the step coverage problem, it has been proposed that CVD or chemical vapor deposited metal be used since this deposition method is isotropic and covers all surfaces equally, but the quality of CVD metal is not good enough to be the primary conductor in the metallization system.

Another problem is that as the minimum dimensions are reduced to the one or two micron range then the succeptability to electromigration is increased since there is much less metal in the interconnect and it can be destroyed more easily; electromigration results from high current densities in the small conductors, and contact with phosphorus-containing material such as the phosphosilicate glass used as the insulator layer causes corrosion of the metal.

It is the principal object of this invention to provide an improved method of making contacts to semiconductor integrated circuit devices, particularly VLSI devices having very small dimensions. Another object is to provide contact methods useful for high density integrated circuit devices, wherein contact holes in insulator layers are formed with vertical sidewalls. A further object is to provide a contact method which does not require a high temperature operation to slope the sidewalls of a contact hole. Still another object is to minimize the detrimental effects of electromigration and chemical corrosion.

SUMMARY OF THE INVENTION

In accordance with one embodiment of the invention, a contact and interconnect for an MOS VLSI semiconductor device employs a contact hole in an insulator coating; the contact hole has vertical instead of sloped sidewalls. A first metallization is applied by CVD so that the sidewalls will be coated to a uniform thickness, then this first metal is anisotropically etched to leave metal sidewalls. A second metallization is applied by sputtering or evaporation, which provides a more dense and electromigration-resistant coating. A refractory metal layer may be interposed between the metallization and the silicon substrate, and also between the metal interconnect and the insulator, since the insulator usually contains phosphorus.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENTS

Figure 1:
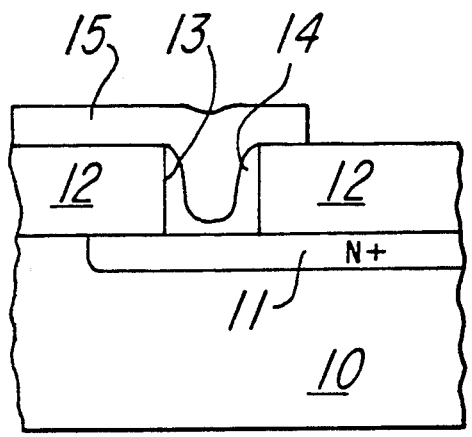
FIG. 1 is an elevation view in section of a contact to a semiconductor device, according to one embodiment of the invention.

Referring to FIG. 1, one method of making contacts in vertical-walled holes is illustrated. A substrate 10, typically P-type silicon, has an N+ region 11 at the surface, and a relatively thick oxide coating 12 such as phosphosilicate glass thereon. Usually the glass has been "flowed" to form a smooth upper surface. A vertical-walled hole 13 is formed in the coating 12 by an anisotropic etch such as the RIE process. The sidewalls of the hole 13 are covered with a material 14 (in this case aluminum) by the process of first depositing a uniform coating over the entire face of the substrate, on top of the insulator 12 as well as on the sidewalls of the hole 13 by a CVD process which is isotropic; then, the metal 14 is preferentially removed by anisotropic etch so that it remains on the sidewalls but not on top of the insulator 12. Then, an aluminum (or other metal) coating is applied by sputtering or the like, and then this coating is patterned to leave an interconnect strip 15.

Figure 2:
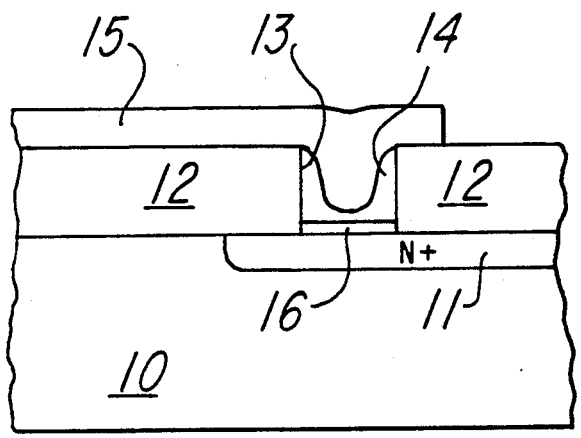
FIG. 2 is an elevation view in section of a contact to a semiconductor device, according to another embodiment of the invention.

In FIG. 2, another version of the technique of making contacts with vertical sidewalls is shown. This structure is the same as that of FIG. 1, except that a thin layer 16 composed of selectively deposited tungsten, for example, acts as a barrier between the aluminum or other metal 14 (and 15) and the N+ silicon; the barrier functions to prevent the aluminum from having an adverse effect upon the substrate, such as by spiking through the thin (usually arsenic-implanted) region 11. The layer 16 can also improve the conductivity of the contact, i.e., make the contact of lower resistance or ohmic instead of slightly rectifying. Using well-known procedures, layer 16 forms only at the base of the contact hole 13 because the sidewalls and face are of phosphosilicate glass.

Figure 3:
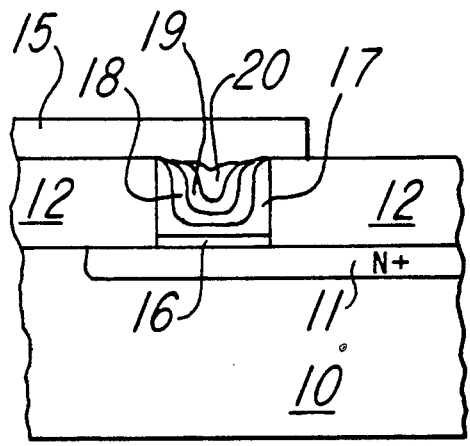
FIG. 3 is an elevation view in section of a contact to a semiconductor device, according to still another embodiment of the invention.

In FIG. 3, a further embodiment of the concept of the invention is illustrated. In order to fill the hole 13 to the level of the top of the layer 12, a succession of layers 17, 18 and 19 is employed. The reason for using this structure is that the selective reaction of tungsten stops after about 2000 Å of deposition. Preferably, the hole 13 should be completely filled, but this cannot be done in a single deposition. Accordingly, first a layer 17 of polysilicon is deposited by CVD, then an anistropic etch to leave the poly on the sidewalls, a layer 18 of tungsten is deposited selectively (i.e., it will not deposit on the silicon oxide, only on the polysilicon 17) so no etch is needed, then an other layer 19 of polysilicon, another anisotropic etch, and then another layer 20 of tungsten is deposited selectively (no anisotropic etch). The number of layers shown here is merely an example, and would depend upon the depth and width of the contact hole. The upper layer 20 of tungsten may be left in place beneath the aluminum layer 15 to function as a barrier between the aluminum and the phosphorus-containing insulator.

Figure 4:
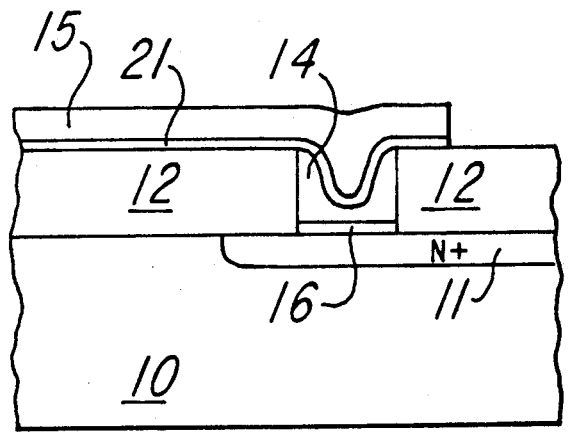
FIG. 4 is an elevation view in section of a contact to a semiconductor device, according to a further embodiment of the invention.

Referring to FIG. 4, an embodiment of the invention is shown which is similar to that of FIG. 2 except that a barrier layer 21 extends beneath all of the aluminum strip 15 to protect the contact and interconnect from the effects of the high phosphorus content of the insulator 12. This barrier layer 21 is composed of CVD-deposited tungsten, for example; this layer is deposited after the anisotropic etch of the CVD metal 14, and before the sputtering or evaporation of metal 15, and both layers 21 and 15 are patterned at the same time so the layer 21 is only under the contact and interconnect.

The reason the aluminum layers 14 and 15 are not laid down at the same time is that CVD aluminum is not of adequate quality to be the primary interconnect, but is adequate for use as a contact plug and fill material.

The primary feature of the invention is that there is not need for the wall of the contact hole to be sloped. Thus, there is no need for a high temperature operation (referred to as densification or flowing) to slope the walls. Also, the process does not need any special etches as have been proposed to slope the sidewalls. The low-quality CVD aluminum is left only in the contact hole where there is little jeopardy in electromigration related problems; the contact can be sintered in H to promote the conductivity, and/or selectively heated as by a laser to form a contact only where desired, as for special programming. The contact size can be reduced since the CVD metal 14 can be deposited in smaller holes than sputtering or evaporation.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor device comprising:
   a region in a face of a semiconductor body,
   an insulator coating on said face having a contact hole over said region, said contact hole having substantially vertical sidewalls,
   a first coating of chemical vapor deposited metal continuously covering said sidewalls and the bottom of said contact hole but not extending over the face of the insulator coating,
   and a metal strip extending along the face over said insulator and also extending into said contact hole over said first coating.

2. A device according to claim 1 wherein said semiconductor is silicon, said insulator is a phosphosilicate glass, said first coating is metal, and said metal strip is composed of the same said metal as said first coating.

3. A device according to claim 1 wherein a barrier layer is interposed between said first coating and said region in said face.

4. A device according to claim 3 wherein said barrier layer is a refractory metal.

5. A device according to claim 1 wherein alternate layers of different conductors cover said sidewalls to substantially fill said contact hole.

* * * * *